United States Patent [19]

Swan et al.

[11] Patent Number: 5,356,828
[45] Date of Patent: Oct. 18, 1994

[54] METHOD OF FORMING MICRO-TRENCH ISOLATION REGIONS IN THE FABRICATION OF SEMICONDUCTOR DEVICES

[75] Inventors: Stephen W. Swan, Sterling; Ellen G. Piccioli, Marlboro, both of Mass.

[73] Assignee: Digital Equipment Corporation, Maynard, Mass.

[21] Appl. No.: 86,598

[22] Filed: Jul. 1, 1993

[51] Int. Cl.$^5$ .................................... H01L 21/76
[52] U.S. Cl. ............................. 437/67; 437/63; 437/64; 437/68; 148/DIG. 50; 156/662
[58] Field of Search ............. 437/67, 63, 64, 72, 437/68; 148/DIG. 50; 156/662

[56] References Cited

U.S. PATENT DOCUMENTS

| | | | |
|---|---|---|---|
| 4,104,086 | 8/1978 | Bondur et al. | 437/67 |
| 4,419,813 | 12/1983 | Iwai | 437/63 |
| 4,465,532 | 8/1984 | Fukano | 156/662 |
| 4,506,434 | 3/1985 | Ogawa et al. | 437/67 |
| 4,533,430 | 8/1985 | Bower | 156/662 |
| 4,631,803 | 12/1986 | Hunter et al. | 148/DIG. 50 |
| 4,952,524 | 8/1990 | Lee et al. | 437/67 |
| 5,118,384 | 6/1992 | Harmon et al. | 156/662 |
| 5,175,122 | 12/1992 | Wang et al. | 437/67 |

FOREIGN PATENT DOCUMENTS 0135743  8/1984  Japan ..................... 437/67

OTHER PUBLICATIONS

Chin et al.; "Structural Effects on a Submicron Trench Process" J. Electrochem. Soc., vol. 132; pp. 1705–1707, Jul. 1985.

Swan et al., "Micro-Trenching During Polysilicon Plasma Etch," SPIE 1803:2–12 (1992).

*Primary Examiner*—Tom Thomas
*Assistant Examiner*—Trung Dang
*Attorney, Agent, or Firm*—Robert J. Feltovic; Denis G. Maloney; Albert P. Cefalo

[57] ABSTRACT

A method of forming micro-trench isolation regions with a separation of 0.20 μm to 0.35 μm in the fabrication of semiconductor devices involves forming an silicon dioxide layer on select locations of a semiconductor substrate and depositing a polysilicon layer onto the silicon dioxide layer. A layer of photoresist is then deposited over select areas of the polysilicon layer and patterned to form micro-trench isolation regions of widths between about 0.2 μm to about 0.5 μm and aspect ratio of between about 2:1 to about 7:1. Thereafter, the isolation regions are etched for a time and pressure sufficient to form micro-trenches in the substrate surface. The micro-trenches will generally have a width ranging from about 1000 Å to about 3500 Å and depth ranging from about 500 Å to about 5000 Å. The layer of photoresist is then removed to expose the polysilicon layer and a channel stop implant is deposited and aligned with the micro-trenches. A thermal silicon dioxide layer is formed in the micro-trenches and an undoped silicon dioxide layer is deposited onto the polysilicon layer to fill the micro-trenches. A planar silicon dioxide layer is then deposited onto the undoped silicon dioxide layer and the undoped and planar silicon dioxide layers are then etched back to expose the polysilicon layer. After etchback, the polysilicon layer is stripped to provide the micro-trench isolation regions.

14 Claims, 3 Drawing Sheets

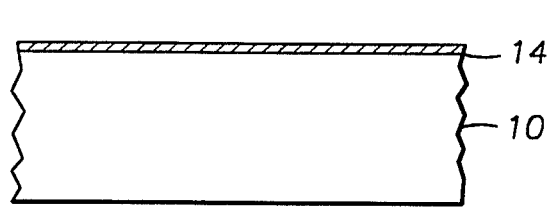
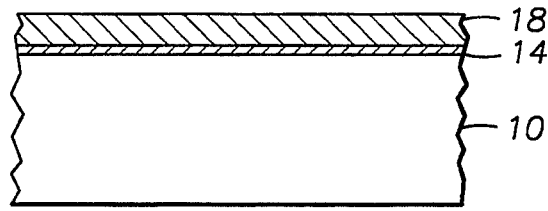
FIG. 1        FIG. 2
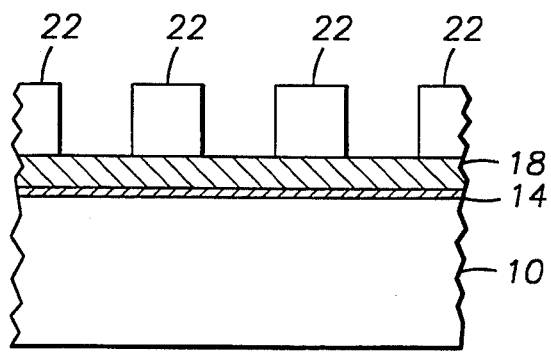
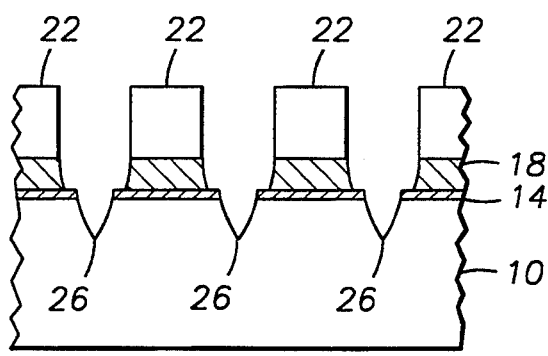
FIG. 3        FIG. 4
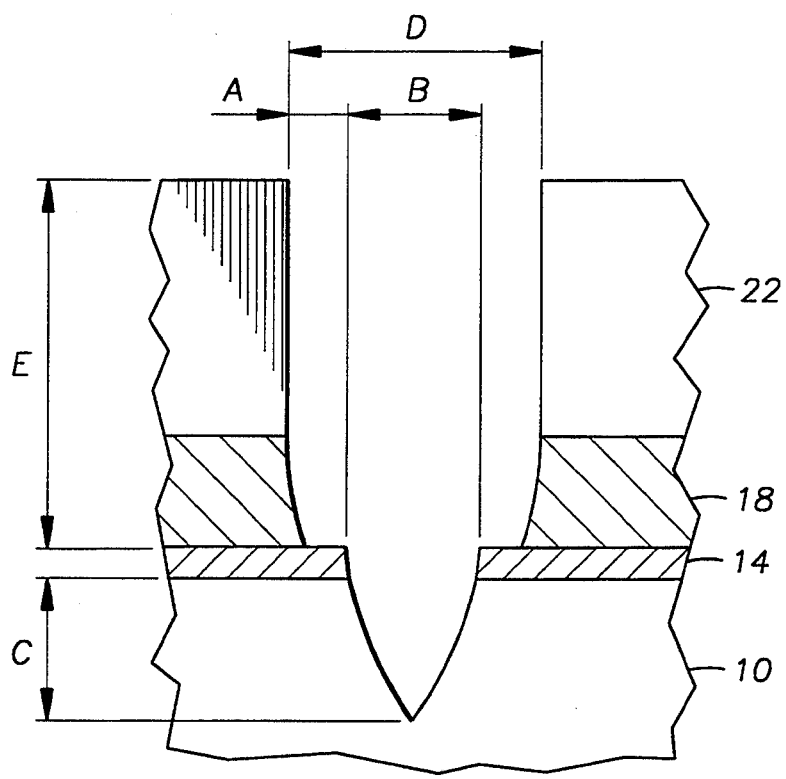
FIG. 4B

METHOD OF FORMING MICRO-TRENCH ISOLATION REGIONS IN THE FABRICATION OF SEMICONDUCTOR DEVICES

FIELD OF THE INVENTION

The present invention relates generally to manufacturing semiconductor devices, and more particularly to methods of forming micro-trench isolation regions in the fabrication of semiconductor devices.

BACKGROUND OF THE INVENTION

Many electronic integrated circuits are formed by a strategic placement and interconnection of selected electronic devices, such as transistors and the like, within a semiconductor substrate. The electronic devices are interconnected using an array of surface conductors carrying data signals through which the devices communicate. The electronic devices, however, must be sufficiently isolated from one another so that the signals in each respective electronic device do not interfere with and degrade the others' signal quality.

Device isolation is typically achieved using local oxidation of silicon ("LOCOS") or shallow trench isolation ("STI"). In these device isolation techniques, isolation is commonly provided by forming a recess or trench between two active areas, upon which the electronic devices are located, and filling the trench with an isolation material. In either shallow trench isolation processes or local oxidation of silicon isolation techniques, the isolation for devices is typically spaced at 0.5 $\mu$m or greater and a physical delta-$\omega$ (difference between the drawn active area width and actual active area width) of 0.30 $\mu$m or greater.

There is a need in the industry for a technique to allow fabrication of channel devices with denser packing, and thus separated by narrower isolation regions. The present inventive process provides a means to form device isolation trenches separated by about 0.10 $\mu$m to about 0.35 $\mu$m, about one-half the distance available with current technology. Further, the process yields a small physical delta-$\omega$ of less than about 0.1 $\mu$m. This process is a modification of conventional processing and does not require advanced photolithography or plasma etch equipment. Thus, there is a significant cost benefit to employing the inventive technology, since other techniques to achieve similar results would require extensive and costly capital improvement. The present inventive process takes advantage of the characteristics of micro-trenching by incorporating them into isolation trenches. When the present inventive process is used in conjunction with standard techniques, such as STI, a device can be fabricated with variable trench width and variable distances between the trenches.

SUMMARY OF THE INVENTION

The present invention provides a method of forming closely spaced micro-trench isolation regions in the fabrication of semiconductor devices. The micro-trenches formed can be used to separate active areas by minimum widths of between about 0.20 $\mu$m to about 0.35 $\mu$m and generally have a delta-$\omega$ of about 0.1 $\mu$m or less. The method involves forming a silicon dioxide layer on a semiconductor substrate surface. A hard film layer such as polysilicon or silicon nitride is then deposited on the silicon dioxide layer and a layer of photoresist is deposited and patterned on the hard film. The exposed areas of the hard film are etched to transfer the photoresist pattern into the hard film. By running the etching process at relatively high pressure, between about 200 mT to about 500 mT, with etchants having a polysilicon:oxide selectivity of greater than about 30:1, deep micro-trenches can be formed in the semiconductor substrate layer. After forming the micro-trenches, the layer of photoresist is removed to expose the hard film layer and the hard film layer is then cleaned. A channel stop implant is then performed which is self-aligned with the hard film and a thermal silicon dioxide layer is then formed in the micro-trenches of the substrate surface. An undoped silicon dioxide layer is deposited onto the hard film layer to fill the micro-trenches and a planar silicon dioxide layer is deposited onto the undoped silicon dioxide layer. The silicon dioxide layers are then removed by exposure to etchants and the hard film layer is stripped to achieve the final product. In a typical process, the hard film layer will be polysilicon.

The method of this invention is useful in forming micro-trench isolation regions with a separation of about 0.20 $\mu$m to about 0.35 $\mu$m between active regions. The present process provides devices having a small physical delta-$\omega$ (<0.1 $\mu$m) and enhances the ability to build MOS transistor arrays with a greater packing density than is presently possible using conventional techniques. Further, device simulations have shown that the isolation regions produced by the present inventive process can be adequate for a 2.5 or 3.3 volt technology. This method may be used in conjunction with STI to fabricate devices with variable spacing between active areas.

BRIEF DESCRIPTION OF THE DRAWINGS

The following detailed description, which sets forth other advantages of the present invention, refers to the accompanying drawings in which the elements have been given reference numerals. These drawings, which are not drawn to scale, are briefly described below.

FIGS. 1 through 12 and 4B are diagrammatic cross-sectional views showing successive stages of forming micro-trench isolation regions in a semiconductor device.

DETAILED DESCRIPTION OF THE PREFERRED EMBODIMENTS

Figure 5:
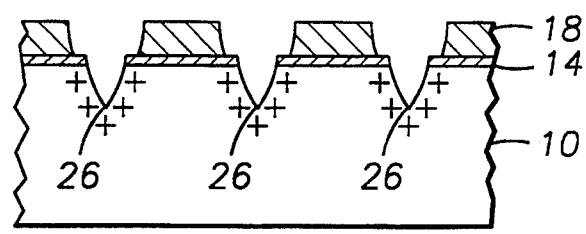

The method of this invention is used in forming micro-trench isolation regions in semiconductor devices having a separation of 0.20 $\mu$m–0.35 $\mu$m between active areas and a delta-$\omega$ of about 0.1 $\mu$m or less. This device isolation method may be used independently or may be used in conjunction with another device isolation technique such as LOCOS or STI. These other device isolation techniques would be used for devices having a separation of greater than 0.35 $\mu$m between active areas.

Referring now to the drawings, FIG. 1 shows a silicon semiconductor substrate 10 having a silicon dioxide layer 14 deposited thereon. The silicon dioxide layer 14 is typically about 90 Å thick and can be grown by various conventional techniques, such as thermal oxidation. The silicon dioxide layer 14 will typically range from 60 Å to about 120 Å.

Referring to FIG. 2, a hard film layer (mask) 18 such as polysilicon is then deposited onto the silicon dioxide layer 14. The hard film layer will typically range from about 2000 Å to about 4000 Å. It is preferable to use undoped polysilicon rather than doped polysilicon because undoped polysilicon tends to etch with a sloped profile, and thereby enhances subsequent micro-trench formation. While the presently described embodiment features an undoped polysilicon layer 18, a silicon nitride layer can be used to advantage, especially if high nitride:oxide selectivity could be achieved.

As shown in FIG. 3, a layer of photoresist 22 is then patterned onto portions of the polysilicon layer 18. During the resist patterning, only those areas which are to be used for the micro-trench isolation are open. The exposed areas generally have a width of about 0.2 μm to about 0.5 μm. The width of resist layers between trenches is not critical and the resist is typically about 0.5 μm to about 2.0 μm thick. It is preferred that the aspect ratio of resist and polysilicon thickness to trench width range from about 2:1 to about 7:1. Subsequent micro-trenching into the silicon substrate increases with narrower trench spaces and higher aspect ratio. The resist pattern spacing can vary depending on the ultimate desired spacing of the micro-trench packing.

Micro-trenches are defined as narrow grooves etched through the gate dielectric and into underlying silicon during the overetch portion of a polysilicon gate plasma etch process. The micro-trenches can be spaced away from the base of the polysilicon line by 600–800Å. They are formed as the result of an increase in the localized etch rate due to bombardment by charged ions scattered from the polysilicon/resist sidewall.

The height of the polysilicon/resist stack and width of the space between lines have a direct impact on the formation of micro-trenches as does the ion energy. Higher aspect ratio serves to focus the ions toward the center of the space; ion bombardment greater than some critical energy will cause silicon dioxide breakdown at the center of the space while the region adjacent the polysilicon line will remain intact.

Assuming that incoming ions of the etch process reflect off the sidewalls at an angle equal but opposite to the incident angle, theoretically the reflected ions are focused at the point where micro-trenching occurs. Thus, the tapered polysilicon sidewall acts as a "focusing mirror" that causes ions to be reflected to the region adjacent the polysilicon line at a distance that is related to the slope of the sidewalls. Thus, resist lines with sloped sidewalls are more likely to produce microtrenching than resist lines with steep or vertical sidewalls. Further, if asymmetric resist sidewalls are formed, the placement of the micro-trench can be manipulated. For example, if one sidewall is tapered and the other is vertical, the wall with a shallow angle can yield a greater number of reflected ions than the opposing vertical wall. This increase in reflected ions would result in a micro-trench closer to the base of the tapered wall.

The exposed patterned polysilicon layer 18 is then etched in a conventional plasma etch system such as RIE or MERIE plasma etch system with either $Cl_2$ or $Cl_2$ and HBr. See FIG. 4A. The etching process should be run at a pressure of between about 200 mT to about 500 mT and have a polysilicon oxide selectivity of greater than 30:1. With use of undoped polysilicon, the etching results advantageously in a slight tapering of the polysilicon sidewalls. Micro-trenches will form during the first 30–60 seconds of the overetch. Depth is controlled by varying the total etch time. Generally, the micro-trenches of this process are formed having a width ranging from about 1000 Å to about 3500 Å, and a depth ranging from about 500 Å to about 5000 Å.

Micro-trenches 26 are formed in the silicon substrate 10 during the overetch step. The micro-trenching is due to an enhanced etch reaction which occurs as a result of ion scattering from the resist/polysilicon sidewall. The depth of the micro-trenches can be varied by adjusting the etch time after the silicon dioxide surface is exposed. A V-shaped groove forms in the silicon at the center of the space between the two polysilicon sidewalls and increases with overetch time at a rate of approximately 1500 Å./min. in depth and 750 Å/min. in width. For example, typical micro-trench dimensions for a 120 sec. overetch would be a trench width in the silicon substrate 10 of about 1500 Å and a trench depth of about 3000 Å. See exploded view in FIG. 4B. Typical dimensions for the given regions are as follows:

| Region | Typical Dimension |
| --- | --- |
| a. Unetched Shoulder | 400–800Å |
| b. Micro-trench Width | 1000–3500Å |
| c. Micro-trench Depth | 500–5000Å |
| d. Space Between Lines | 2000–5000Å |
| e. Polysilicon/Resist Stack | 5000–20,000Å |

As used herein, "micro-trenches" are narrow V-shaped grooves that are etched through the gate silicon dioxide and into the underlying semiconductor substrate in the space between two hard film lines. Under preferred applications, the semiconductor substrate is silicon and the hard film is polysilicon. The etch process replicates the resist pattern while creating a slight taper (about 83°) of the polysilicon sidewall. The micro-trenches generally are spaced away from the base of the polysilicon lines by a shoulder of approximately 400–800 Å and are formed as a result of increased localized etch rate between closely spaced polysilicon lines. The increase in etch rate is due to ions scattering off the resist/polysilicon sidewalls and reflecting to the base of the polysilicon line. The scattering is enhanced under conditions of increasing aspect ratios (depth:width) and increasing pressure. Thus, in the present inventive process, the resist trench width is typically in the range of about 0.2 μm to about 0.5 and aspect ratios of about 2:1 to about 7:1. In the open area, i.e., regions where the aspect ratio is less than 1:1, there is essentially no punch through to the substrate layer because the etch rate is slower (~0.4 Å/sec).

Figure 6:
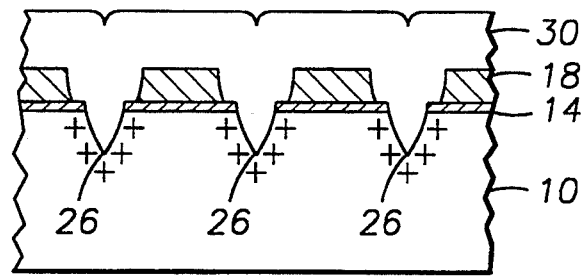

As shown in FIG. 5, the layer of photoresist 22 is then removed by a plasma strip to expose the polysilicon layer 18. The polysilicon layer 18 is then cleaned, for example with sulfuric peroxide, and a channel stop implant is then performed. The channel stop implant, which is typically boron in the case of n-channel transistors, is self-aligned to the micro-trenches 26 and does not require an additional mask step. Referring to FIG. 6, a thermal silicon dioxide layer is then formed in the micro-trenches 26 which have been formed in the substrate 10. The thermal silicon dioxide layer is formed during a combination drive/thermal oxidation step. Typically, the thermal silicon dioxide layer should be grown to a thickness of about 200 Å to anneal any physical damage to the semiconductor substrate 10 which occurred while activating the channel stop implant.

Figure 7:
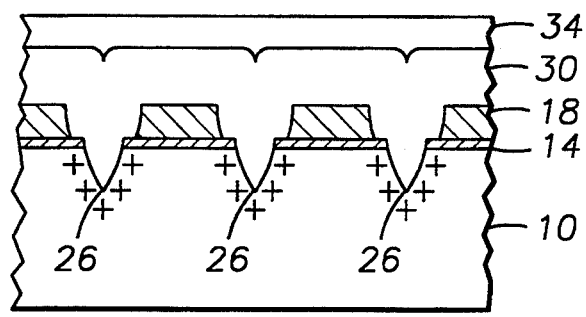

After the micro-trenches 26 have been formed, they are now ready to be filled with silicon dioxide and the surface planarized. In the present method with reference to FIG. 6, the semiconductor substrate 10 is then processed through a silicon dioxide deposition 30, e.g., undoped CVD silicon dioxide (TEOS) which fills the micro-trenches 26 and covers the semiconductor substrate with a uniform layer of undoped silicon dioxide 30. In FIG. 7, a planar doped silicon dioxide layer 34 such as spin-on glass, BPSG, or $B_2O_3$, is then deposited onto the undoped silicon dioxide layer 30.

Figure 8:
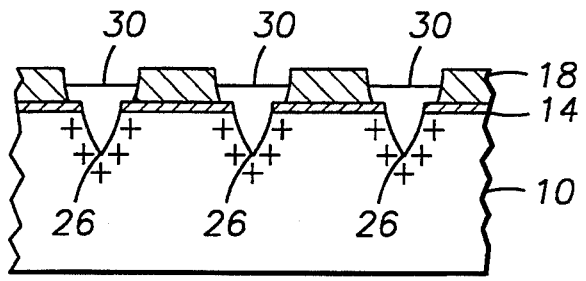

Referring to FIG. 8, the silicon dioxide layers 30 and 34 are then removed by chemical etching. Etching is typically achieved using a conventional reactive ion etch system with end-point capability. The etching process is stopped at a pre-determined time after the polysilicon layer 18 is detected to leave a plug of silicon dioxide 30 over the isolated micro-trenches.

Figure 9:
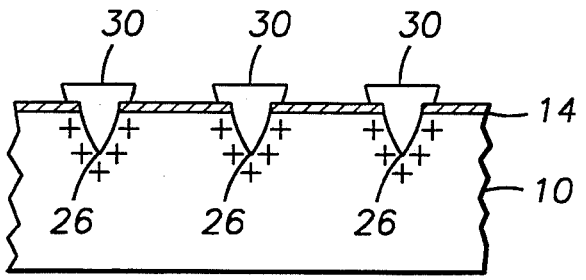

With reference to FIG. 9, the polysilicon layer 18 is then stripped in a plasma process that has a high selectivity for polysilicon relative to silicon dioxide, typically greater than 40:1. The stripping process is stopped when the silicon dioxide layer 14 is detected.

Figure 10:
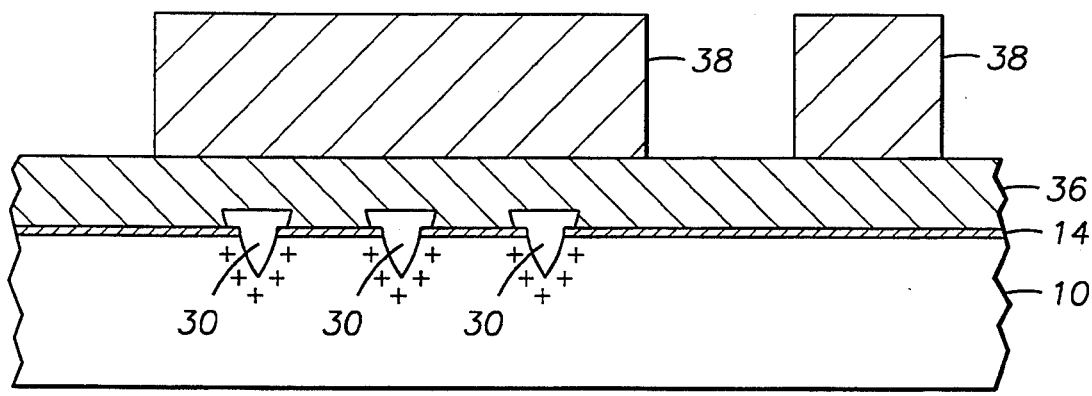
Figure 11:
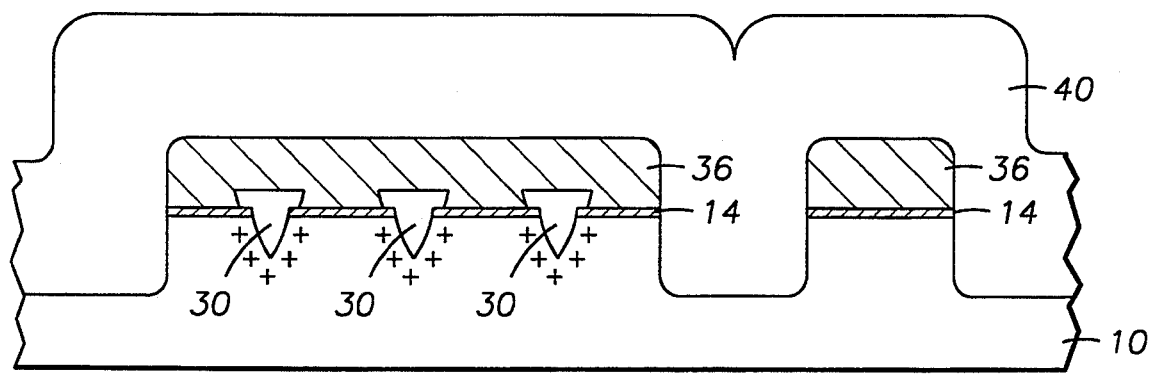
Figure 12:
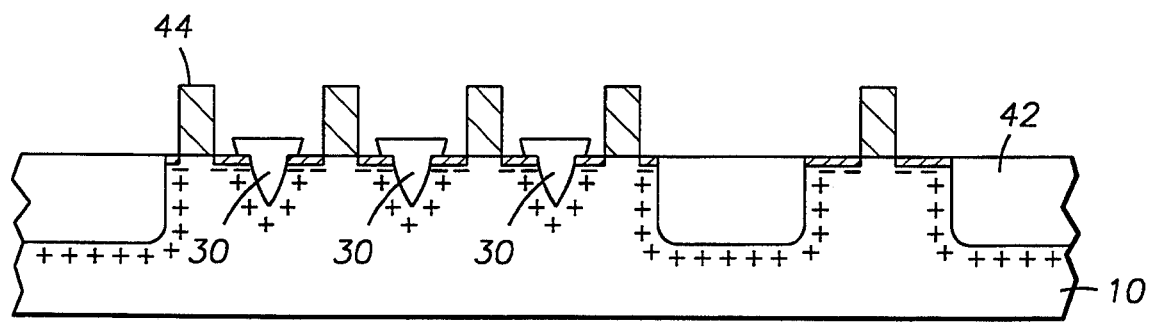

Following completion of this micro-trench isolation process, the semiconductor substrate 10 can be processed through other isolation processes such as LOCOS or STI to form additional isolation trenches for devices spaced at greater than 0.35 μm. See FIGS. 10, 11, 12 for a representative embodiment. For example, as shown in FIG. 10, the pad silicon dioxide layer 14 is grown (~225 Å), a silicon nitride layer 36 is deposited (~1800 Å) and a resist mask 38 is applied to select regions and overlapping the micro-trench regions 30. Next, as shown in FIG. 11, the resist pattern is transformed into silicon to form shallow trench isolation areas and the wafer is capped with CVD silicon dioxide 40 (TEOS-based) (about 6500 Å thick) after a short thermal oxidation and channel stop implant. Afterward, as illustrated in FIG. 12, the isolated shallow trenches 42 are planarized with the gate 44 and silicon silicon dioxide areas formed in the conventional manner.

While the inventive system has been particularly shown and described with reference to these various embodiments, it will be recognized by those skilled in the art that modifications and changes may be made to the present invention described above without departing from the spirit and scope thereof, which is set forth in the following claims.

What is claimed is:

1. A method of forming micro-trench isolation regions in the fabrication of semiconductor devices comprising:

forming a first silicon dioxide layer on a semiconductor substrate surface;

depositing a hard film layer on the first silicon dioxide layer;

depositing a layer of photoresist over the hard film layer and patterning the photoresist to provide open regions having widths between 0.2 μm to 0.5 μm and an aspect ratio of photoresist and hard film layer thickness to open region width of between 2:1 to 7:1;

etching the exposed hard film by a plasma etch process to form micro-trenches in the substrate surface having widths between 1000 Å to 3500 Å;

removing the layer of photoresist to expose the hard film layer;

implanting an n- or p-channel-stop inplant into the substrate and aligned with the micro-trenches; and forming and planarizing a second silicon dioxide layer in the micro-trenches of the substrate surface.

2. The method of claim 1 wherein the semiconductor substrate is doped or undoped silicon.

3. The method of claim 1 wherein the first silicon dioxide layer ranges from 60 Å to 120 Å silicon dioxide thick.

4. The method of claim 1 wherein the hard film is undoped silicon nitride.

5. The method of claim 1 wherein the hard film is doped polysilicon.

6. The method of claim 1 wherein the hard film is doped polysilicon.

7. The method of claim 1 wherein the photoresist is between 0.5 μm to 2.0 μm thick.

8. The method of claim 1 wherein the etching of the exposed hard film is performed at a pressure of between 200 mT and 500 mT.

9. The method of claim 1 wherein the etching of the exposed hard film is accomplished with an etchant having a polysilicon:oxide selectivity of greater than 30:1.

10. The method of claim 1 wherein the micro-trench formed in the substrate layer is 1000 Å to 3500 Å wide and 500 Å to 5000 Å deep.

11. The method of claim 1 wherein the second silicon dioxide layer is formed by the steps comprising:

forming a thermal silicon dioxide layer in the micro-trenches;

depositing a second silicon dioxide layer onto the hard film layer to fill the micro-trenches;

depositing a planar silicon dioxide layer onto the second silicon dioxide layer;

etching the second and planar silicon dioxide layers to expose the hard film layer; and stripping the hard film layer to provide a planarized micro-trench isolation region.

12. The method of claim 11 wherein the thermal silicon dioxide layer formed in the micro-trenches is between 200 Å and 2400 Å thick.

13. The method of claim 11 wherein the planar silicon dioxide layer is a doped silicon dioxide.

14. The method of claim 11 wherein the hard film layer is stripped in a plasma process with an etchant having a polysilicon:oxide selectivity greater than 40:1.

* * * * *